(12) United States Patent
Ting

(10) Patent No.: US 9,961,422 B2
(45) Date of Patent: May 1, 2018

(54) APPARATUS OF FAN HEAT DISSIPATION

(71) Applicants: Inventec (Pudong) Technology Corporation, Shanghai (CN); INVENTEC CORPORATION, Taipei (TW)

(72) Inventor: Kuo-Chi Ting, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 78 days.

(21) Appl. No.: 15/166,290

(22) Filed: May 27, 2016

(65) Prior Publication Data

US 2017/0155984 A1    Jun. 1, 2017

(30) Foreign Application Priority Data

Nov. 27, 2015    (CN) .......................... 2015 1 0847645

(51) Int. Cl.
*H04R 1/02*    (2006.01)
*H04R 1/28*    (2006.01)
*H05K 7/20*    (2006.01)

(52) U.S. Cl.
CPC .............. *H04R 1/021* (2013.01); *H04R 1/028* (2013.01); *H04R 1/2811* (2013.01); *H05K 7/20136* (2013.01)

(58) Field of Classification Search
CPC ...... H04R 1/021; H04R 1/028; H04R 1/2811; H04R 1/2807; H04R 1/28; H04R 1/02; H04R 2499/11; H05K 7/20136
USPC .......................................... 381/353, 338, 345
See application file for complete search history.

(56) References Cited

U.S. PATENT DOCUMENTS 5,792,999 A * 8/1998 Arnold ................. G10K 11/172
                                                                  181/141
2012/0051573 A1* 3/2012 Litovsky .............. H04R 1/2834
                                                                  381/345

* cited by examiner

*Primary Examiner* — Sunita Joshi
(74) *Attorney, Agent, or Firm* — CKC & Partners Co., Ltd.

(57) ABSTRACT

An apparatus of fan heat dissipation comprises a fan component, a resonator and a speaker component. The fan component is located below a device in parallel and configured to dissipate heat from the device. The resonator is located below the fan component, and a working region is located between the bottom of the fan component and the top of the resonator. The speaker component is formed with the resonator, and the resonator serves as a cabinet for the speaker component. Furthermore, the resonator is the Helmholtz resonator.

9 Claims, 3 Drawing Sheets

APPARATUS OF FAN HEAT DISSIPATION

RELATED APPLICATIONS

This application claims priority to Chinese Application Serial Number 201510847645.3, filed Nov. 27, 2015, which is herein incorporated by reference.

BACKGROUND

Field of Invention

The present disclosure relates to a heat-dissipating device. More particularly, the present disclosure relates to an apparatus of fan heat dissipation.

Description of Related Art

With the rapid advance of technology, an operation frequency of an electronic device are therefore increased for supporting additional functions, so as to enhance the competitiveness of the electronic device. However, an operation temperature of the electronic device is also increased as the operation frequency increased. To avoid the high operation temperature affecting or damaging operation of the electronic device, a heat-dissipating fan is always utilized to dissipate heat for the electronic device.

Nevertheless, it is only considered how to enhance operation efficiency of the heat-dissipating fan, but not to reduce operation noise generated from the operation of the heat-dissipating fan before. Specifically, when the heat-dissipating fan operates on a high rotation mode, the operation efficiency for heat dissipation is significant but the operation noise is loud; otherwise, the operation noise is quite but the operation efficiency is insignificant.

Accordingly, it is difficult to consider how to enhance the operation efficiency for heat dissipation and reduce the operation noise for an apparatus of fan heat dissipation design at the same time.

SUMMARY

An aspect of the present disclosure is directed to an apparatus of fan heat dissipation. The apparatus comprises a fan component, a resonator and a speaker component. The fan component is located below a device in parallel and configured to dissipate heat from the device. The resonator is located below the fan component, and a working region is located between the bottom of the fan component and the top of the resonator. The speaker component is formed with the resonator, and the resonator serves as a cabinet for the speaker component. Furthermore, the resonator is the Helmholtz resonator.

It is to be understood that the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
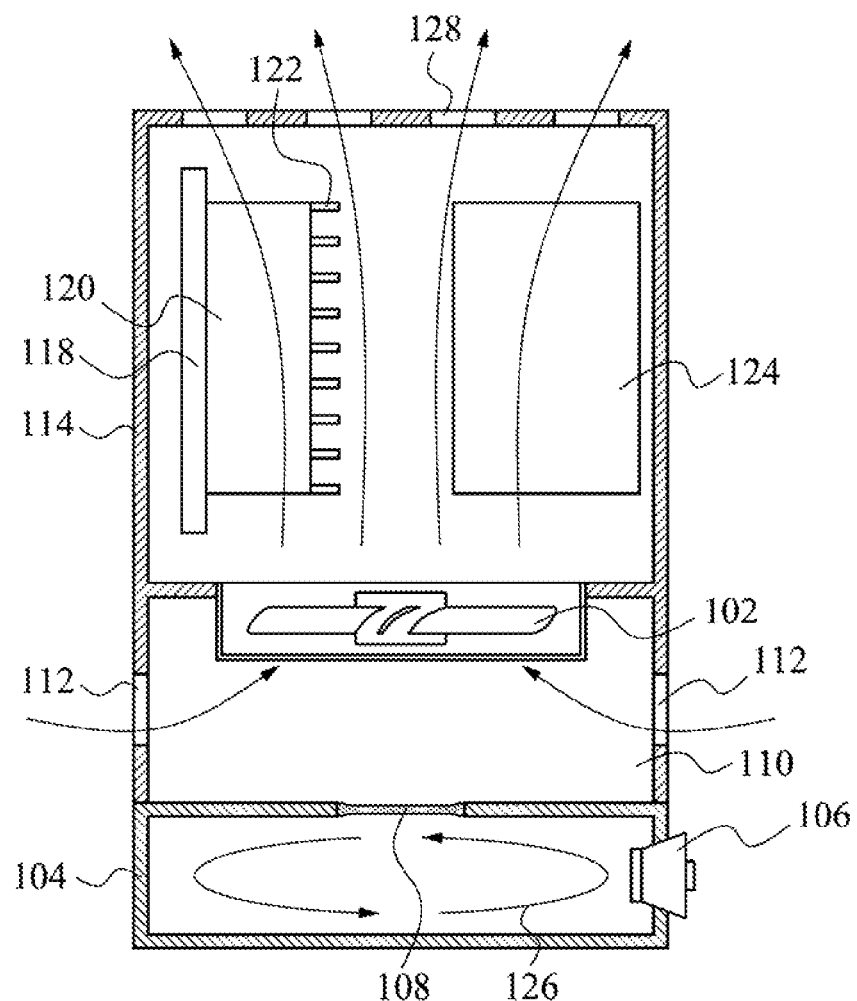
FIG. 1 is a schematic diagram of the interior of an apparatus of an heat dissipation according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of the interior of an apparatus of fan heat dissipation 100 according to some embodiments of the present disclosure. As show in FIG. 1, the apparatus of fan heat dissipation 100 comprises a fan component 102, a resonator 104 and a speaker component.

The fan component 102 is located parallel below a processor 120 and a storage device 124, and the fan component 102 is configured to dissipate heat for the processor 120 and the storage device 124. The processor is electrically connected on a printed circuit board (PCB), and multiple heat-dissipating fins 122 are located on the processor 120 to increase heat-dissipating area for the processor 120. The processor 120 and the storage device 124 are encapsulated in a host shell 114 formed with the fan component 102. Furthermore, there are multiple air inlet holes 112 located on the side of the host shell 114 below the fan component 102 and multiple air outlet holes 128 located on the top of the host shell 114 above the fan component 102. With such arrangements, when the fan component 102 operates, the fan component 102 inlets air from the air inlet holes 112 and outlets air to the air outlet holes 128. For example, the processor 120 can be a central processing unit (CPU), the storage device 124 can be implemented by a hard disk drive (HDD) or a memory. The arrangements of the processor 120 and the storage device 124 are given for illustrative purposes. Various arrangements of the processor 120 and the storage device 124 are within the contemplated scope of the present disclosure.

The resonator 104 is located blow the fan component 102, and there is a working region 110 between the bottom of the fan component 102 and the top of the resonator 104. Specifically, the working region 110 is located below the fan component 102 above the top of the resonator 104, and the working region 110 is encapsulated in the host shell 114. Accordingly, when the fan component 102 operates, the fan component 102 inlets air from the air inlet holes 112 through the working region 110. The resonator 104 comprises a resonant diaphragm 108. The resonant diaphragm 108 is formed with the top of the resonator 104, and the resonant diaphragm 108 is configured to transmit energy generated from air vibration led by an operation of the fan component 102 to the interior of the resonator 104, so as to generate standard waves 126. Specifically, when the fan component 102 operates, the fan component 102 inlets air, and the air vibration is led by that of operation of the fan component 102. In some embodiments, the shape of the resonant diaphragm 108 can be a circular diaphragm formed on the top of the resonator 104, and the resonant diaphragm 108 is located directly below the fan component 102.

In some embodiments, the shape of the resonant diaphragm 108 is a circular diaphragm formed with the top of the resonator 104, and the resonator 104 is the Helmholtz resonator. Accordingly, the rule to establish the Helmholtz resonator is as follows:

$$f_0 = \frac{c}{2\pi} \cdot \sqrt{\frac{S}{(L+0.8d) \cdot V}},$$

$f_0$ denotes a resonant frequency of the Helmholtz resonator, c denotes the velocity of sound, S denotes a cross sectional area of the resonant diaphragm 108, d denotes a diameter of the resonant diaphragm 108, V denotes a capacity of the resonator 104, and L denotes a thickness of the connection between the resonator 104 and the resonant diaphragm 108.

For illustration, when the resonant frequency $f_0$ is determined, relational expression among the cross sectional area S, the diameter d, the capacity V and the thickness L are also determined. As a result, the resonator 104 can be established based on that of the relational expression. In some embodiments, the shape of the resonator 104 can be a triangular prism, a quadrangle prism or a cylinder.

With the arrangements for the Helmholtz resonator, the speaker component 106 is formed with the resonator 104, and the resonator 104 is configured as a cabinet for the speaker component 106 when the speaker component 106 operates. Specifically, when the speaker component 106 is disabling, the resonator 104 is configured to reduce noise led by the operation of the fan component 102 through characteristics of the Helmholtz resonator; otherwise, the resonator 104 is configured as the cabinet to amplify default frequencies of sound generated by the speaker component 106 through stand waves 126. The stand waves 126 are generated from the air vibration led by the operation of the fan component 102. Specifically, when the fan component 102 operates, the fan component 102 inlets air, and the air vibration is led by that of operation of the fan component 102. Therefore, the energy generate from the air vibration is transmitted to the interior of the resonator 104 through the resonant diaphragm 108 to generate the stand waves 126 corresponding to the default frequencies of the sound generated by the speaker component 106. In some embodiments, the speaker component 106 is formed with the side or the bottom of the resonator 104.

In some embodiments, the resonator 104 is a rigid body. For example, the rigid body can be made of metal, ceramics, plastics or wood, and the resonant diaphragm 108 can be a pulp diaphragm, a plastic diaphragm, a metal diaphragm or a synthetic fiber diaphragm.

Figure 2:
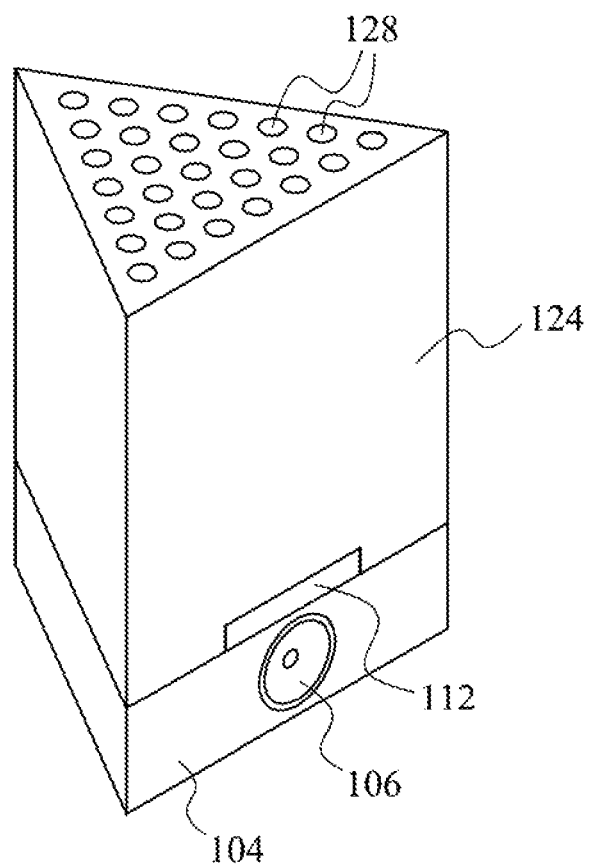
FIG. 2 is a schematic diagram of the exterior of the apparatus of fan heat dissipation according to some embodiments of the present disclosure.

Reference s now made to FIG. 2. FIG. 2 is a schematic diagram of the exterior of the apparatus of fan heat dissipation according to some embodiments of the present disclosure. As shown in FIG. 2, there are multiple air inlet holes 112 on the side of the host shell 112 and multiple air outlet holes 128 on the top of the host shell 112. For illustration, when the fan component 102 operates, the fan component 102 inlets air from the air inlet holes 112 and outlets air to the air outlet holes 128. Furthermore, the host shell 114 is compactly connected to the resonator 104. Specifically, the connection between the host shell 114 and the resonator 104 has a smooth junction or has no insignificant convexity and concavity. In some embodiments, the speaker component 106 is formed with the side or the bottom of the resonator 104.

In some embodiments, the shape of the host shell 114 and the resonator 104 are triangular prisms, and the host shell 114 is compactly connected to the resonator 104. Specifically, the connection between the host shell 114 and the resonator 104 has a smooth junction or has no insignificant convexity and concavity. For example, in other embodiments, the shape of the host shell 114 and the resonator 104 are modified, and the aforementioned arrangements are modified accordingly.

In some embodiments, the resonator 104 is a rigid body. For example, the rigid body can be made of metal, ceramics, plastics or wood, and the resonant diaphragm 108 can be a pulp diaphragm, a plastic diaphragm, a metal diaphragm or a synthetic fiber diaphragm.

Figure 3:
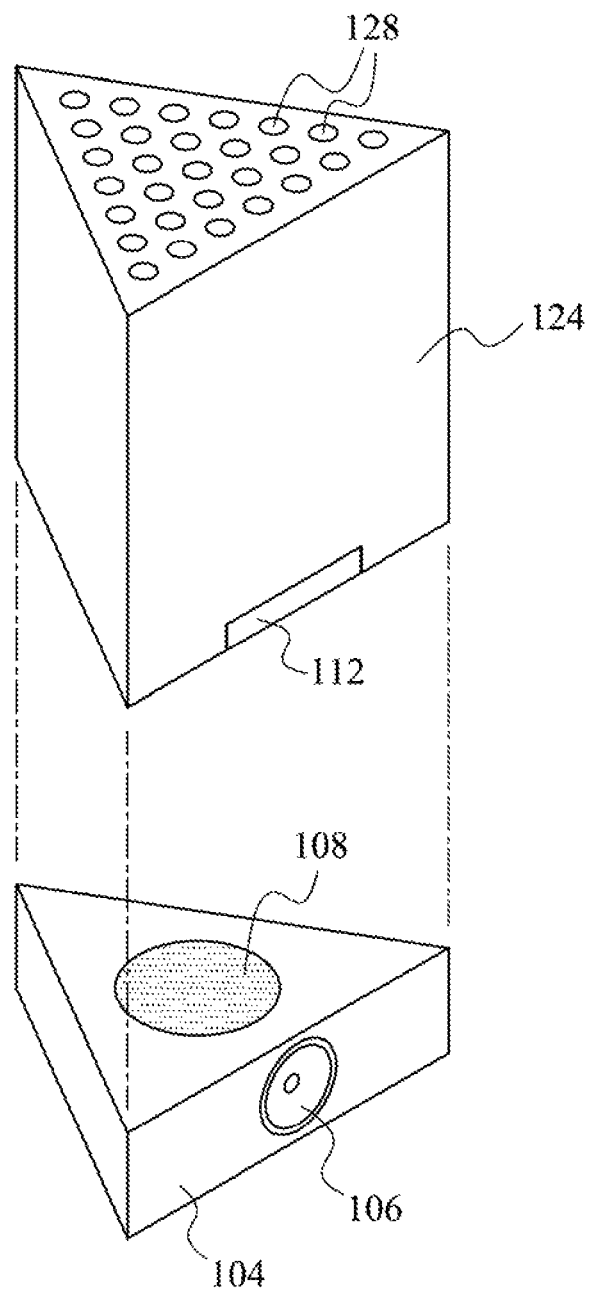
FIG. 3 is a schematic diagram of the apparatus of fan heat dissipation according to some embodiments of the present disclosure.

Reference is now made to FIG. 3. FIG. 3 is a schematic diagram of the apparatus of fan heat dissipation according to some embodiments of the present disclosure. As shown in FIG. 3, there are multiple air inlet holes 112 on the side of the host shell 112 and multiple air outlet holes 128 on the top of the host shell 112. For illustration, when the fan component 102 operates, the fan component 102 inlet air from the air inlet holes 112 and outlet air to the air outlet holes 128. Furthermore, the host shell 114 is compactly connected to the resonator 104. Specifically, the connection between the host shell 114 and the resonator 104 is smooth or with insignificant convex and concave.

In some embodiments, the resonant diaphragm 108 is form with the top of the resonator 104, and the resonant diaphragm 108 is compactly connected to the resonator 104. Specifically, the connection between the resonant 108 and the resonator 104 is smooth or with insignificant convex and concave. The speaker component 106 is formed with the resonator 104, and the resonator 104 is configured as the cabinet when the speaker component 106 operates. Furthermore, the resonator 104 is the Helmholtz resonator. In some embodiments, the speaker component 106 is formed with the side of the bottom of the resonator 104.

Specifically, when the speaker component 106 is disabling, the resonator 104 is configured to reduce the noise led by the operation of fan component 102 through the characteristics of the Helmholtz resonator; otherwise, the resonator 104 is configured as the cabinet to amplify the sound generated by the speaker component 106 through the stand waves 126. The stand waves 126 are generated from the air vibration led by the operation of the fan component 102. Specifically, when the fan component 102 operates, the fan components 102 inlets air, and the air vibration is led by that of operation of the fan component 102. Therefore, the energy generated from the air vibration is transmitted to the interior of the resonator 104 through the resonant diaphragm 108 to generate the stand waves 126 corresponding to the default frequencies of the sound generated by the speaker component 106. In some embodiments, the speaker component 106 is formed with the side or the bottom of the resonator 104.

In some embodiments, the shape of the host shell 114 and the resonator 104 are triangular prisms, and the host shell 114 is compactly connected to the resonator 104. Specifically, the connection between the host shell 114 and the resonator 104 has a smooth junction or has no insignificant convexity and concavity. For example, in other embodiments, the shape of the host shell 114 and the resonator 104 are modified, and the aforementioned arrangements are modified accordingly.

In some embodiments, the resonator 104 is a rigid body. For example, the rigid body can be made of metal, ceramics, plastics or wood, and the resonant diaphragm 108 can be a pulp diaphragm, a plastic diaphragm, a metal diaphragm or a synthetic fiber diaphragm.

As described above, with the arrangements for the Helmholtz resonator, the apparatus of fan heat dissipation 100 in the present disclosure is able to reduce the noise led by the operation of the fan component and amplify the sound generated by the speaker component. For illustration, when the speaker component is disabling, the apparatus of fan heat dissipation is configured to reduce the noise led by the operation of the fan component through the characteristics of Helmholtz resonator; otherwise, the Helmholtz resonator is configured as the cabinet to amplify the default frequencies of the sound generated by the speaker component to enhance acoustic quality of experience. Specifically, the present disclosure provides the apparatus of fan heat dissipation not only enhances the heat-dissipation effect and reduces the noise for the fan component, but also enhances the acoustic quality of experience for the speaker component.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present invention cover modifications and variations of this present disclosure provided they fall within the scope of the following claims.

What is claimed is:

1. An apparatus of fan heat dissipation, the apparatus comprising:
    a fan component located below a device in parallel and configured to dissipate heat from the device;
    a resonator located below the fan component, wherein a working region is located between a bottom of the fan component and a top of the resonator; and
    a speaker component formed with the resonator, the resonator serving as a cabinet for the speaker component;
    wherein the resonator is a Helmholtz resonator;
    wherein the resonator comprises:
    a resonant diaphragm formed with the top of the resonator and configured to transmit energy generate from air vibration led by an operation of the fan component to an interior of the resonator.

2. The apparatus of claim 1, wherein the device is a processor or a storage device, and the device is encapsulated in a host shell formed with the fan component.

3. The apparatus of claim 2, wherein the host shell comprises:
    a plurality of air outlet holes located on a top of the host shell.

4. The apparatus of claim 1, wherein the resonant diaphragm is located directly below the fan component.

5. The apparatus of claim 1, wherein the working region comprises:
    a plurality of air inlet holes located on the side of the working region,
    wherein the fan component inlets air from the air inlet holes through the working region for dissipating the heat from the device, and the working region is closed except the air inlet holes and the fan component.

6. The apparatus of claim 1, wherein the resonator is a rigid body.

7. The apparatus of claim 6, wherein the rigid body is made of metal, ceramics, plastics or wood.

8. The apparatus of claim 1, wherein the speaker component is formed with the side or the bottom of the resonator.

9. The apparatus of claim 1, wherein the shape of the resonator is a triangular prism, a quadrangle prism or a cylinder.

* * * * *